United States Patent
Ludwig et al.

(10) Patent No.: US 12,387,867 B2
(45) Date of Patent: Aug. 12, 2025

(54) POLYHEDRAL COIL SYSTEMS HAVING A LARGE HOMOGENEITY VOLUME AND LARGE ACCESS ZONE

(71) Applicant: STL SYSTEMS AG, Tägerwilen (CH)

(72) Inventors: Christoph Ludwig, Constance (DE); Stefan Ludwig, Frauenfeld (CH); Wolfgang Ludwig, Tägerwilen (CH)

(73) Assignee: STL SYSTEMS AG, Tägerwilen (CH)

( * ) Notice: Subject to any disclaimer, the term of this patent is extended or adjusted under 35 U.S.C. 154(b) by 957 days.

(21) Appl. No.: 17/049,069

(22) PCT Filed: Apr. 18, 2019

(86) PCT No.: PCT/EP2019/060056
§ 371 (c)(1),
(2) Date: Oct. 20, 2020

(87) PCT Pub. No.: WO2019/202063
PCT Pub. Date: Oct. 24, 2019

(65) Prior Publication Data
US 2021/0241961 A1 Aug. 5, 2021

(30) Foreign Application Priority Data
Apr. 20, 2018 (DE) .................. 10 2018 109 505.8

(51) Int. Cl.
*H01F 27/28* (2006.01)
*G01R 33/00* (2006.01)

(52) U.S. Cl.
CPC ......... *H01F 27/28* (2013.01); *G01R 33/0017* (2013.01)

(58) Field of Classification Search
CPC .. H01F 27/28; H01F 7/202; H01F 2017/0073; G01R 33/0017
See application file for complete search history.

(56) References Cited

U.S. PATENT DOCUMENTS 5,168,211 A * 12/1992 Laukien ............. G01R 33/3806
324/319
5,311,129 A * 5/1994 Ludwig ................ G01R 33/022
505/846
(Continued)

FOREIGN PATENT DOCUMENTS

CN 1669177 A 9/2005
DE 4125733 C1 2/1993
(Continued)

OTHER PUBLICATIONS

International search report for patent application No. PCT/EP2019/060056 dated Jul. 29, 2019.

*Primary Examiner* — Mang Tin Bik Lian
(74) *Attorney, Agent, or Firm* — Bachman & LaPointe, P.C.

(57) ABSTRACT

A coil system (30, 40, 50) for generating a homogeneous magnetic field, includes a coil assembly (2), each assembly having at least two coils (S1, S2, S3), the respective windings (W1, W2, W3) of which span rotationally symmetrical faces lying plane-parallel to one another having different sizes and a common axis of rotation running perpendicularly to the faces, forming a coil axis (4), wherein a current can flow in the opposite direction through at least one of the coils (S1, S2, S3), and having at least two coil assemblies (2), wherein the coils (S1, S2, S3) of each coil assembly (2) are located within and oriented plane-parallel to the base of a generating pyramid, the tip of which coincides with the centre of a regular convex polyhedron and the base surface of which is identical to one such face of the convex polyhedron, on which the projection of the pyramid tip onto the pyramid base surface coincides with the centre of the pyramid base surface.

9 Claims, 6 Drawing Sheets

(56) References Cited

U.S. PATENT DOCUMENTS

| | | | |
|---|---|---|---|
| 2006/0255805 A1* | 11/2006 | Crozier | G01R 33/381 |
| | | | 324/318 |
| 2013/0057270 A1 | 3/2013 | Klein et al. | |
| 2014/0354386 A1 | 12/2014 | Adar et al. | |
| 2017/0040826 A1* | 2/2017 | Arendarik | H01F 38/14 |
| 2018/0231629 A1* | 8/2018 | Top | G01R 33/1276 |
| 2018/0321333 A1* | 11/2018 | Cochrane | G01R 33/0206 |
| 2019/0187222 A1* | 6/2019 | Amit | G01R 33/0005 |

FOREIGN PATENT DOCUMENTS

| | | |
|---|---|---|
| DE | 10315447 A1 | 1/2005 |
| DE | 102005034839 A1 | 2/2007 |
| DE | 102013216378 A1 | 2/2014 |
| GB | 424736 A | 2/1935 |
| JP | 59148308 A | 8/1984 |
| KR | 20170099232 A | 8/2017 |

\* cited by examiner

POLYHEDRAL COIL SYSTEMS HAVING A LARGE HOMOGENEITY VOLUME AND LARGE ACCESS ZONE

BACKGROUND OF THE INVENTION

The invention relates to a coil system for generating a homogeneous magnetic field, the coil system comprising a coil assembly, each coil assembly being composed of at least two coils, the respective windings of said coils forming plane-parallel, rotationally symmetrical surfaces having different sizes and a common axis of rotation as a coil axis running perpendicular to the surfaces, a current flowing in the opposite direction through at least one of said coils.

Coil systems which are based on such a coil assembly realize a coil system suitable for generating homogeneous magnetic fields by adding said coil assembly. In particular if their coil axes are orthogonal to one another, said coil systems are suitable for generating homogeneous fields in any direction. A magnetic field which has a high level of homogeneity in the center of the coil system is virtually unchangeable with respect to the strength and direction and drops rapidly outside the system. If the coil system is realized in a suitable manner, a negligible magnetic far field signature can thus be generated, which can present itself in such a manner that, for example, the magnetic field outside the coil system has already dropped by several magnitudes at a distance of three system sizes; this can be important in order to comply with magnetic limit values, for example. If the coil systems are used reciprocally as a measuring coil, the coil systems are characterized in that they very efficiently suppress interference fields of nearby sources.

Examples of applications are industrial applications such as the calibration of magnetic field sensors, the compensation of magnetic interference fields, the neutralization of magnetic signatures, test and quality controls of permanent magnets and uses in materials research or medical technology, such as magnetic resonance imaging.

The Helmholtz coil is known as a symmetrical coil assembly for generating a homogeneous magnetic field, a current flowing in the same direction through two circle coils of the same size having radius R and being disposed plane-parallel on a common axis at defined distance R.

In order to increase the level of homogeneity of the generated magnetic field in the center of the coil assembly and/or to reduce the far field signature or to suppress interference fields of nearby sources more efficiently, different approaches have been used as the state of the art.

As an evolution of the Helmholtz coil, a symmetrical coil system which has two pairs of Helmholtz coils which are disposed linearly and which comprise coils which have the same diameter is disclosed in patent application EP 2487500 A1. The current flows in the same direction through the two pairs of coils. In order to further increase the uniformity of the magnetic field, it is also known to use pairs of coils which comprise coils which have different diameters and through which current flows in opposite directions. Furthermore, coil assemblies are known which are composed of more than two coils through which current flows in the same direction and which have different radii, such as Braunbek coils (4 coils per axis) or Maxwell coils (3 coils per axis, one of them in the center of the coil).

Furthermore, there are complex coil systems which are disposed multidimensionally, such as Helmholtz coils or Braunbek coils which are triaxially nested in one another in order to increase the homogeneity of the magnetic field while the size of the coil system stays the same.

A disadvantage of the coil systems based on a Helmholtz assembly is that the experimental space in the center of such an assembly, i.e., the usable space in which the magnetic field is essentially homogeneous, is relatively small compared to the dimensions of the entire coil system. In order to obtain a sufficiently large experimental space which has a corresponding charging opening or access area, very large coils might have to be used. In a simple pair of Helmholtz coils which has a coil radius of one meter, for example, the usable space in which the magnetic field is virtually unchangeable is only ±0.2 m. In coil assemblies which have a higher ratio of homogeneity to coil size, the access area is reduced considerably, large coil systems thus having to be selected in order just to guarantee access to the experimental volume.

In particular in the advancements based on the Helmholtz coil, the homogeneity of the magnetic field can be increased—in some cases, design specifications are indicated in order to obtain a specified experimental space of the desired size. However, the large coil dimensions required in proportion to the provided usable experimental space, the limited accessibility of the experimental space as a result of complex coil geometries and, in particular, the fact that, in a 3D system, different coil geometries comprising the resulting coil parameters occur for each axis remain unsatisfactory.

SUMMARY OF THE INVENTION

Therefore, the object of the present invention is to create a coil system which generates a homogeneous magnetic field, wherein said magnetic field is to extend over a space area as large as possible in proportion to the size of the coil system, wherein the coil system guarantees a large access area of the experimental space while still providing a high level of homogeneity, wherein the coil system is composed of identical coil assemblies and wherein the coil system provides the same coil parameters for each coil axis.

Said object is attained in conjunction with the features disclosed herein by the fact that the coil system is composed of at least two coil assemblies, the coils of the respective coil assembly being located inside and oriented plane-parallel to the base surface of a generating pyramid, the apex of which coincides with the center of a regular, convex polyhedron and the base surface of which is identical to a surface of the convex polyhedron in which the projection of the pyramid apex onto the pyramid base surface coincides with the center of the pyramid base surface.

The generating pyramid is composed of a polyhedron surface as the base surface and the polyhedron center as the pyramid apex. A polyhedron which has n surfaces is composed of n generating pyramids.

In the preferred case of a cube having an edge length a, the generating pyramid has an opening angle of 90°, a square base surface of edge length a and a height of 0.5*a. In the case of a tetrahedron having edge length a, the generating pyramid has an opening angle of 109.5°, an equilateral triangle of edge length a as the base surface, and a height.

The idea of the present invention is thus to provide a coil assembly for a coil system for generating a homogeneous magnetic field, wherein the coil system can be composed of a plurality of said coil assemblies. The position and the orientation of the individual coil assemblies in the coil system is preferably geared to the surfaces of a regular geometric body, such as a regular, convex polyhedron which has n surfaces and which preferably corresponds to a cube by n=6.

The starting point is the coil assembly which is claimed by the features of the preamble and which describes a plane-parallel and coaxial assembly of the cross-sectional surfaces of the coils. According to the invention, the coil system is composed of at least two of said coil assemblies, the coils of the respective coil assembly being located inside the generating pyramid meeting the described geometric requirements.

If the regular, convex polyhedron is realized as a tetrahedron which has four equilateral triangles as surfaces and therefore four triangle pyramids as generating pyramids, a number of four coil assemblies results. If the regular, convex polyhedron is realized as a cube, two or six generating pyramids which have a square base surface are thus provided, each pyramid comprising one coil assembly, depending on whether the magnetic field is to be generated or measured in one or three spatial directions.

Only surfaces in which the projection of the pyramid apex of a generating pyramid constructed on said surface onto the pyramid base surface coincides with the center of the base surface, i.e., the foot of the perpendicular of the pyramid apex is mapped on the center of the pyramid base surface, are suitable as surfaces of the regular, convex polyhedron.

The windings of a coil form a rotationally symmetrical (coil cross-sectional) surface which is a circular surface if the coil geometry is circular (rotational symmetry).

If the windings are laid out along a preferably regular polygonal line, a regular polygon results as the cross-sectional surface of the coil (discrete rotational symmetry), the cross-sectional surface of the coil becoming a square surface having edges of identical length if the coil geometry is rectangular.

With respect to the winding layout, the coils can definitely take different forms, i.e., they can form any rotationally symmetrical surface and can also vary in the axis direction, so long as the surface vector of the coil remains parallel to the coil system axis. For example, a circular coil can be disposed next to a smaller coil which has a square cross section and next to a triangle coil. In this case, currents flow in the opposite direction through at least one of the coils involved.

According to the invention, the radial extension of the individual coils is dimensioned in such a manner that the coils, which are positioned coaxially along a coil axis, can be disposed inside an imaginary pyramid, which is the generating pyramid of the polyhedron. The outer surface of said pyramid is thus the geometric condition for the dimensioning of the outer coil dimensions; however, the coils disposed closer to the pyramid apex usually, but not necessarily, form a smaller surface than the coils located at a greater distance to the pyramid apex.

Coils which have different cross-sectional surface sizes and surface shapes can also be disposed so as to be located in one plane (coplanar).

The essential condition according to the invention is that all coils and their cross-sectional surfaces oriented plane-parallel and coaxial on average can be positioned inside a pyramid which generates the regular, convex system polyhedron.

In this case, the apex 7 (See FIG. 2 discussed below) of each generating pyramid coincides with the center of the polyhedron and the pyramid base surface is identical to a surface of the polyhedron in which the projection of the pyramid apex 7 onto the pyramid base surface coincides with the center of the pyramid base surface.

By means of this geometric condition for the outer coil dimensions of each coil, a plurality of coil assemblies can be disposed in a three-dimensional space on the surfaces of a polyhedron inside (generating) pyramids, the pyramid apices being oriented inward, without physical overlaps of the coils.

In general, the winding shape which forms the (coil cross-sectional) surface is arbitrary.

However, a combination of polygonal surface segments and circle surface segments is preferred. This combination realized by triangle coils or square coils having rounded corners, for example. Furthermore, the rotationally symmetrical surface formed by the respective windings of the coils (S1, S2, S3) can be helical. In another embodiment, a winding shape of one of the windings has, in sections, a component in the direction of the axis of rotation.

The (coil, cross-sectional) surface formed can be realized as an arc-shaped surface, the surface vector of which, however, runs parallel to the axis of rotation over the surface in an integral view.

In an advantageous embodiment, the convex polyhedron is a tetrahedron (triangle pyramid), a hexahedron (cuboid or cube), an octahedron, a dodecahedron or an icosahedron.

The positioning of the coil assemblies inside the generating pyramids which, when put together, form the outer shape of said geometric bodies which have high symmetry properties allows the generation of homogeneous magnetic fields which have a high resistance to interference and simultaneously provides a large experimental space. The required coil dimensions for providing a specific experimental volume can thus be reduced, which advantageously leads to significantly lower manufacturing and operating costs.

The coil systems according to the invention are advantageously used in a system for calibrating magnetic field sensors and magnetic compasses, for generating and simulating magnetic conditions on satellites and space probes, for compensating magnetic fields, for reducing or neutralizing magnetic signatures on ship components, for testing and controlling the quality of permanent magnets, for measuring magnetic properties in materials research and geophysics and for generating magnetic fields and magnetic field gradients in medical technology and magnetic resonance imaging.

BRIEF DESCRIPTION OF THE DRAWINGS

Further advantageous embodiment features are apparent from the following description and from the drawings, which outline a preferred embodiment of the invention by means of examples. In the drawings.

DETAILED DESCRIPTION

Figure 1:
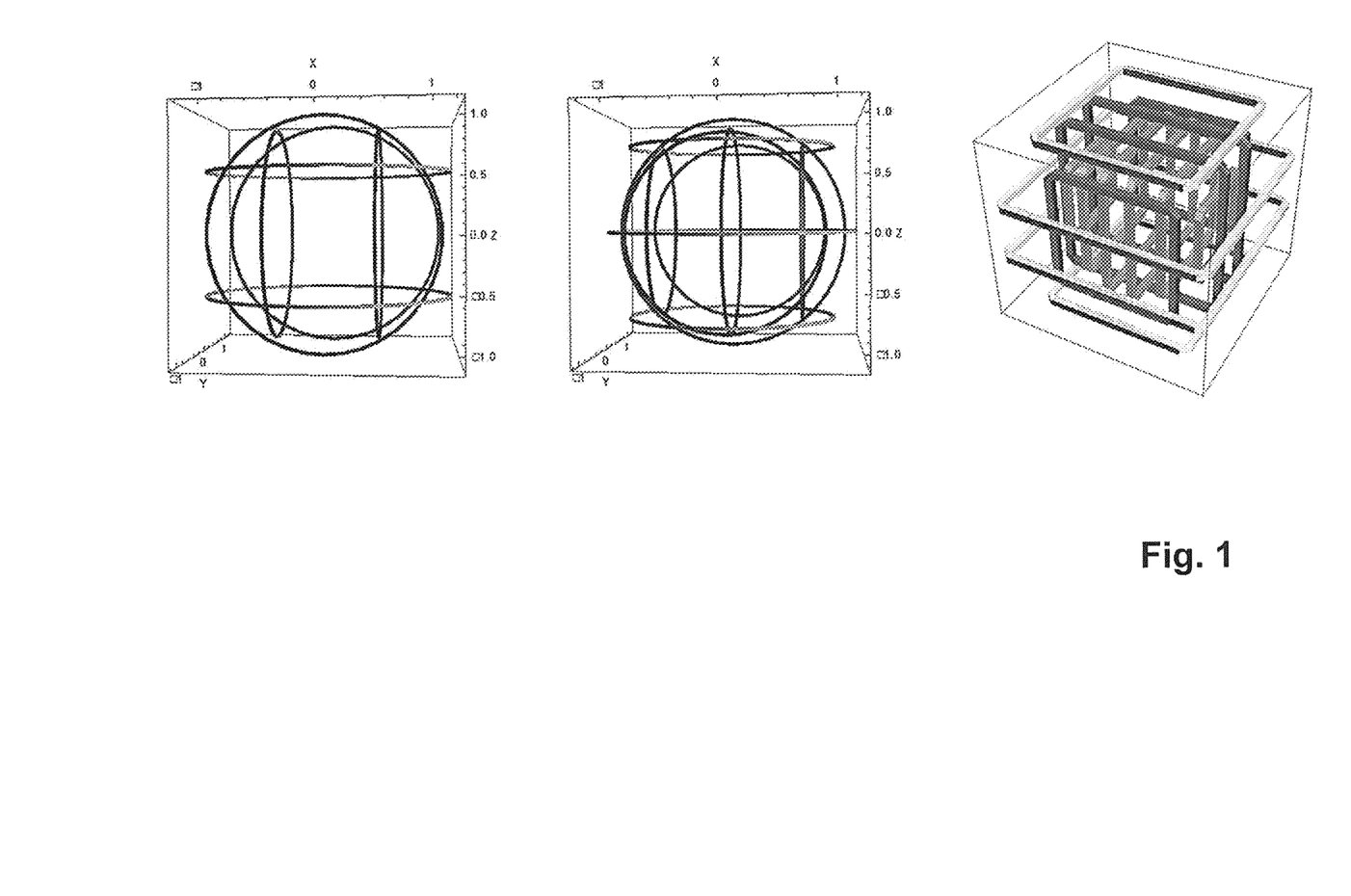
FIG. 1 shows coil assemblies nested in one another from the state of the art.

In FIG. 1, examples of coil assemblies nested in one another for generating a three-dimensional magnetic field are shown. The left representation shows Helmholtz coils nested in one another triaxially, the representation in the middle shows a Maxwell coil system which has three coils per axis, and the right representation shows a Braunbek coil system which has four coils per axis. In all three representations, the coil axes are orthogonal to one another.

Figure 2:
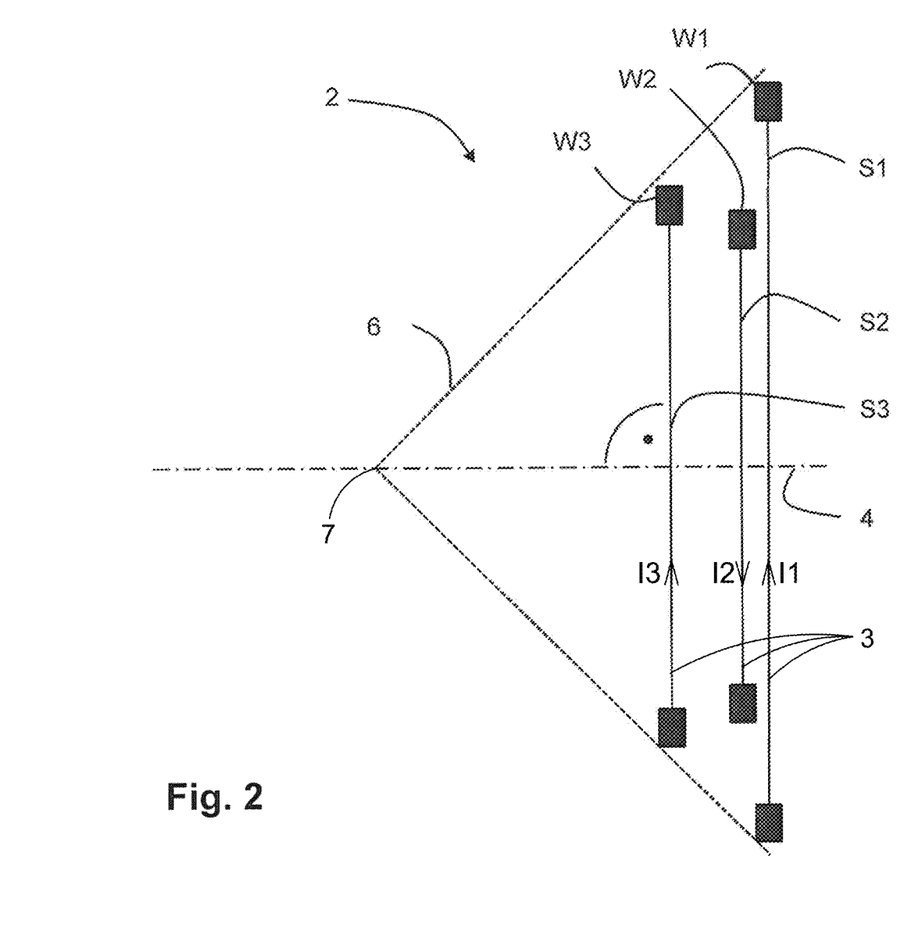
FIG. 2 shows a schematic view of a coil assembly according to the invention which has three coils.

In FIG. 2, a schematic view of a coil assembly 2 according to the invention which has three coils S1, S2, S3 is shown. Coils S1, S2, S3 are disposed in such a manner that the surfaces 3 formed by their respective windings W1, W2, W3 are plane-parallel to one another and have a common axis of rotation as a coil axis 4 which runs perpendicular to the surfaces 3.

According to the invention, coils S1, S2, S3 are dimensioned in such a manner that coils S1, S2, S3 and their outer dimensions can be positioned inside a generating pyramid which has a surface line 6—in the present case shown in a projection.

Figure 3:
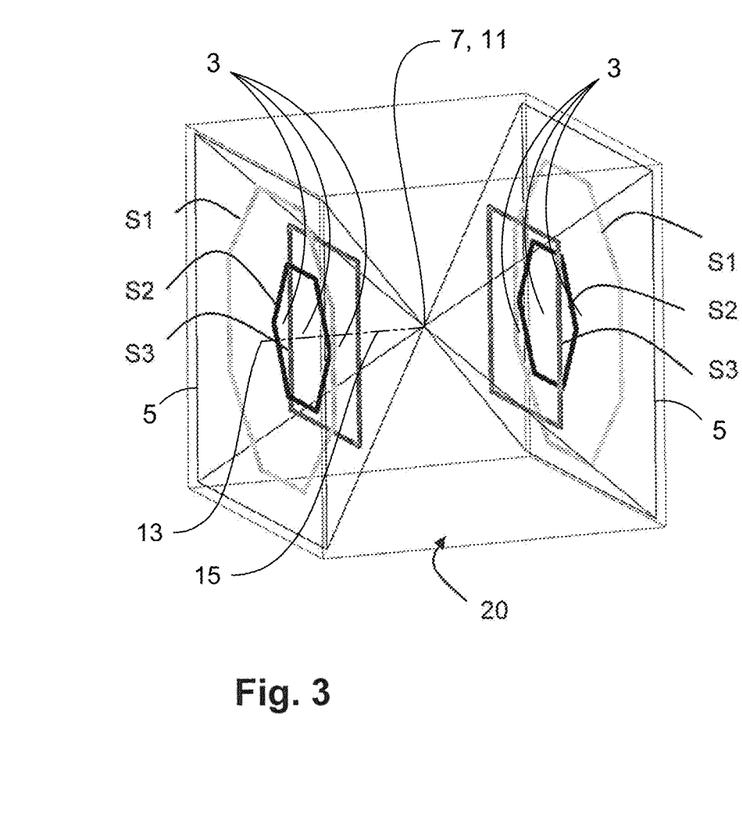
FIG. 3 shows a schematic, spatial representation of a one-dimensional symmetric coil system.

FIG. 3 shows a schematic, spatial representation of a one-dimensional symmetric coil system 20 in which two coil assemblies 2 of FIG. 1 are disposed symmetrically as a basis assembly in such a manner that their coil axes 4 (FIG. 2) are located on a common straight line, the pyramid apices 7 of the pyramids pointing to one another and coinciding with the center 11 of a polyhedron realized as a cube. The projection 15 of each pyramid apex 7 coincides with the center 13 of the pyramid base surface 5.

Figure 4:
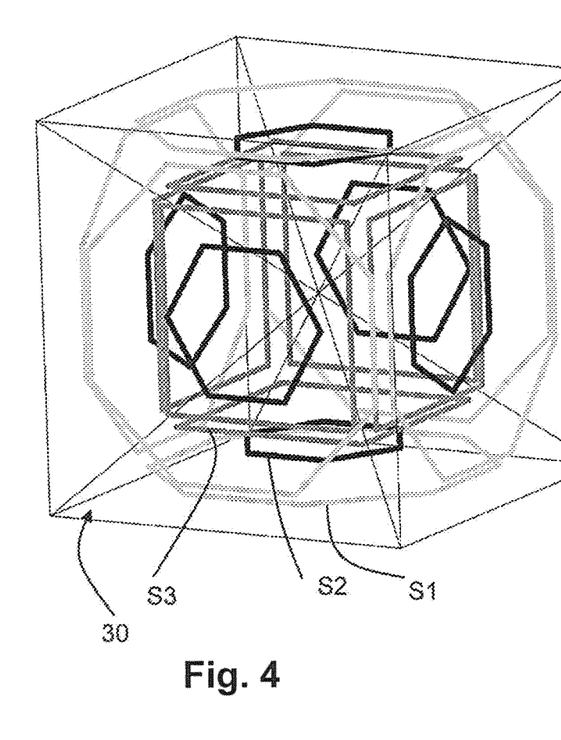
FIG. 4 shows a schematic, spatial representation of a three-dimensional symmetric coil system disposed as a cube.

As an enhancement of a one-dimensional symmetric coil system, a schematic, spatial representation of a three-dimensional symmetric coil system 30 according to the invention which is disposed as a cube is shown in FIG. 4. Corresponding to the number of sides of the convex polyhedron as a cube, coil system 30 is composed of six coil assemblies according to the invention.

Said representation shows that the geometric condition according to the invention that the coils be disposed inside an outer surface of a generating pyramid having an opening angle of 90° must be satisfied in order to be able dispose any number of coils in the external shape of a cube without overlap.

The cubic assembly can be composed of six of such generating pyramids, the base surface 5 of said pyramid corresponding to a lateral surface of the cube.

It is not possible to realize such an orthogonal triaxial assembly on the basis of three identical pairs of Helmholtz coils since the coils would penetrate one another because of the defined ratio of coil size to coil distance of the Helmholtz assembly. For this reason, the aforementioned pairs of coils nested in one another, i.e., pairs of coils having different sizes, have been suggested by the state of the art. However, said assemblies limit the available experimental space and the charging opening in a disadvantageous manner.

By contrast, the realization according to the invention allows a larger experimental space 54 having a larger charging opening 52 compared to the state of the art and therefore a more favorable ratio of the outer dimensions of the coil system to the usable experimental volume.

Figure 5:
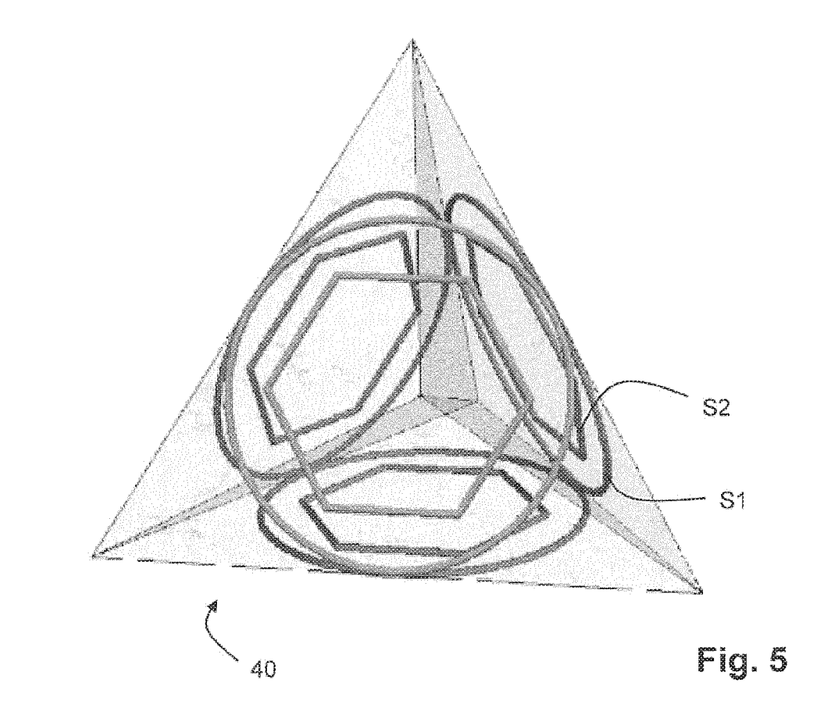
FIG. 5 shows a schematic, spatial representation of a three-dimensional symmetric coil system disposed as a tetrahedron.

FIG. 5 shows a schematic, spatial representation of a three-dimensional symmetric coil system disposed as a tetrahedron. Corresponding to the four surfaces of the tetrahedron, said tetrahedron can be composed of four identical generating pyramids in a volume-filling manner, the respective base surface of the pyramids being an equilateral triangle. Said coil system in the form of a tetrahedron is therefore composed of four identical sub-tetrahedrons (triangle pyramids) within each of which two coils S1, S2 are located.

Figure 6:
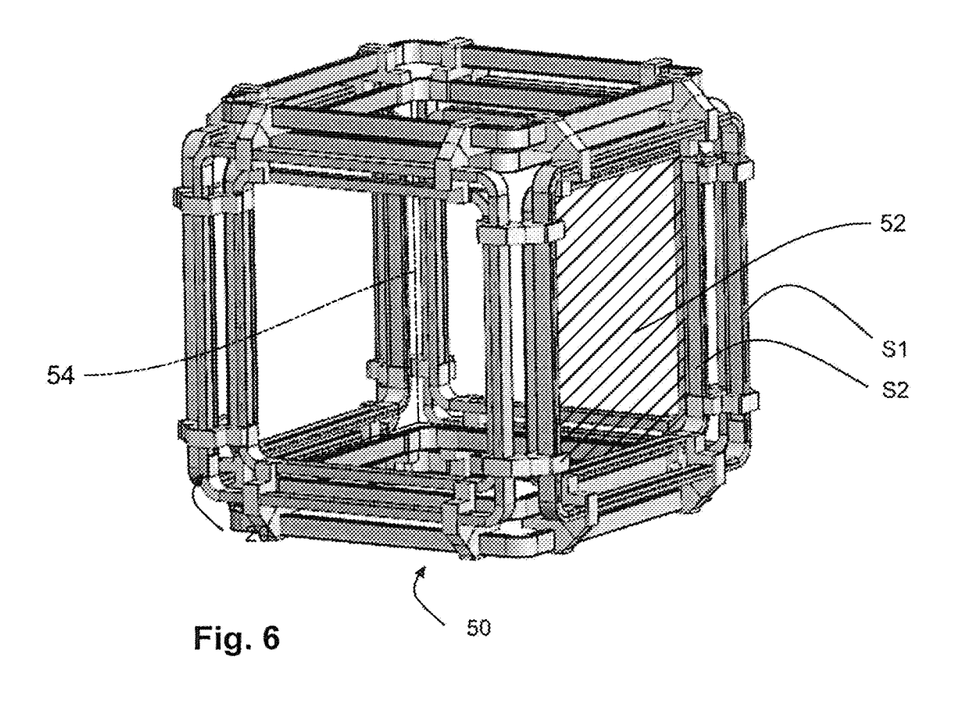
FIG. 6 shows a model of another three-dimensional, symmetric coil system.

FIG. 6 shows a model 50 of a three-dimensional symmetric coil system disposed as a cube. In the model, two coils S1, S2 which represent a coil assembly according to the invention are disposed on each side of the cube. Pairs of coils S1, S2 are dimensioned in such a manner that they can be disposed inside the generating pyramids which fill the volume of the cube. The larger experimental space and its good accessibility in contrast to a nested Helmholtz assembly are clearly identifiable.

Figure 7:
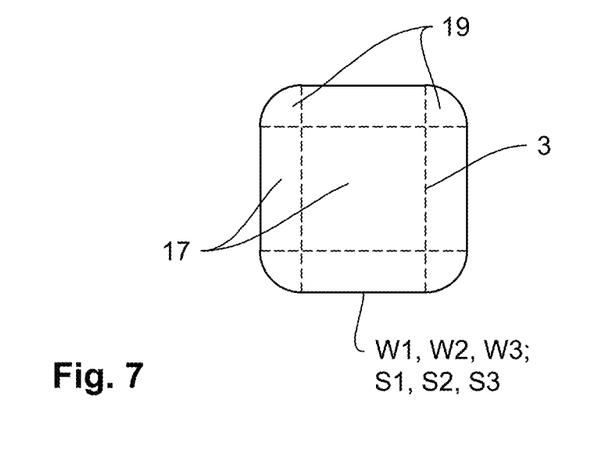
FIG. 7 shows a schematic view of a combination of polygonal surface segments and circle surface segments.

FIG. 7 shows a schematic view of a rotationally symmetrical surface 3 having a combination of polygonal surface segments 17 and circle surface segments 19. A square coil S1, S2, S3 is shown composed of polygonal (rectangular) surface segments 17 and circle surface segments 19 forming the rounded edges.

Figure 8:
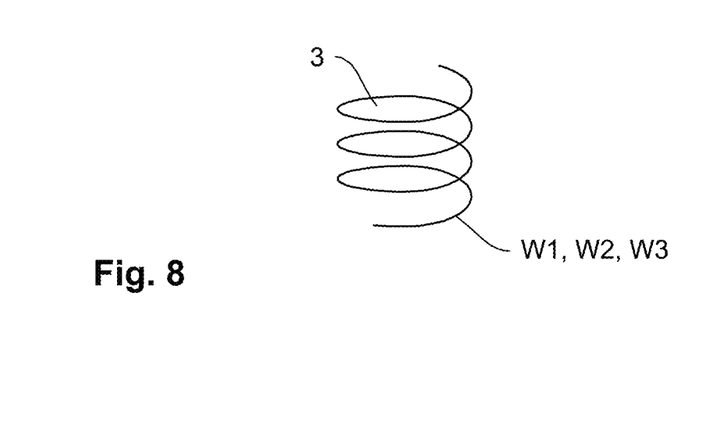
FIG. 8 shows a schematic view of a coil in a spiral shape.

FIG. 8 shows a schematic view of a coil S1, S2, S3 which windings W1, W2, W3 having a spiral (helical) shape.

Figure 9:
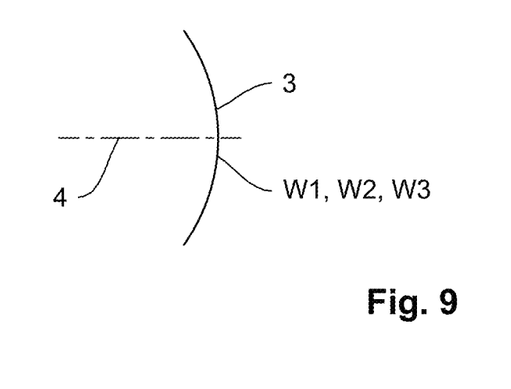
FIG. 9 shows a schematic view of an arc-shaped surface.

In FIG. 9 a schematic view of a coil S1, S2, S3 is shown, whereby the respective windings W1, W2, W3 have an arc-shaped surface in the direction of the axis of rotation 4.

The invention claimed is:

1. A coil system (30, 40, 50) for generating a homogeneous magnetic field and providing a specific and large experimental space (54) which has a corresponding charging opening or access area (52), the coil system (30, 40, 50) comprising at least three coil assemblies (2), each coil assembly (2) being composed of at least two coils (Si, S2, S3), respective windings (W1, W2, W3) of the at least two coils (S1, S2, S3) forming plane-parallel, rotationally symmetrical surfaces (3) having different sizes and a common axis of rotation as a coil axis (4) running perpendicular to the rotationally symmetrical surfaces (3), a current (11, 12, 13) flowing through at least one of said coils (S1, S2, S3) in an opposite direction in relation to another one of said coils (Si, S2, S3), wherein the coils (S1, S2, S3) of each of the coil assemblies (2) being located inside and oriented plane-parallel to a base surface (5) of a generating pyramid, an apex (7) of the generating pyramid coincides with a center (11) of a regular, convex polyhedron and the base surface (5) of the generating pyramid is identical to such a surface of the convex polyhedron in which a projection (15) of the apex (7) onto the base surface (5) coincides with a center (13) of the base surface (5), wherein the convex polyhedron is a tetrahedron, a hexahedron, an octahedron, a dodecahedron or an icosahedron which has a number of n surfaces and is composed of n generating pyramids in a volume-filling manner, wherein the windings comprise a first winding (W2) having a first diameter, and a second winding (W3) having a second diameter, and wherein the first winding (W2) is further from a pyramid apex (7) of the coil system than the second winding (W3), and wherein the first diameter is smaller than the second diameter.

2. The coil system according to claim 1, wherein a rotationally symmetrical surface (3) formed by the respective windings (W1, W2, W3) of the respective coils (S1, S2, S3) is a combination of polygonal surface segments (17) and circular surface segments (19).

3. The coil system according to claim 1, wherein the rotationally symmetrical surface (3) formed by the respective windings (W1, W2, W3) of one of the coils (S1, S2, S3) is realized in a spiral shape.

4. The coil system according to claim 1, wherein a winding shape of one of the windings (W1, W2, W3) has, in sections, a component in the direction of the axis of rotation (4).

5. A use of the coil system (30, 40, 50) according to claim 1 in a system for calibrating magnetic field sensors and magnetic compasses, for generating and simulating magnetic conditions on satellites and space probes, for compensating magnetic fields, for reducing or neutralizing magnetic signatures on ship components, for testing and controlling the quality of permanent magnets, for measuring magnetic properties in materials research and geophysics and for generating magnetic fields and magnetic field gradients in medical technology and magnetic resonance imaging.

6. The coil system according to claim 2, wherein the rotationally symmetrical surface (3) formed by the respective windings (W1, W2, W3) of one of the coils (S1, S2, S3) is realized in a spiral shape.

7. The coil system according to claim 2, wherein a winding shape of one of the windings (W1, W2, W3) has, in sections, a component in the direction of the axis of rotation (4).

8. The coil system according to claim 3, wherein a winding shape of one of the windings (W1, W2, W3) has, in sections, a component in the direction of the axis of rotation (4).

9. The coil system according to claim 1, wherein the windings comprise a first winding (W2), a second winding (W3) and a third winding (W1), and wherein spacing between the first winding (W2) and the second winding (W3) is different from spacing between the first winding (W2) and the third winding (W1).

* * * * *